United States Patent
Hsu et al.

(10) Patent No.: US 11,751,398 B2
(45) Date of Patent: Sep. 5, 2023

(54) MEMORY STRUCTURE AND OPERATION METHOD THEREOF

(71) Applicant: eMemory Technology Inc., Hsinchu (TW)

(72) Inventors: Chia-Jung Hsu, Hsinchu County (TW); Woan-Yun Hsiao, Hsinchu County (TW); Wein-Town Sun, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 128 days.

(21) Appl. No.: 17/401,262

(22) Filed: Aug. 12, 2021

(65) Prior Publication Data

US 2022/0085039 A1  Mar. 17, 2022

Related U.S. Application Data

(60) Provisional application No. 63/078,343, filed on Sep. 15, 2020.

(51) Int. Cl.
| | | |
|---|---|---|
| *G11C 16/04* | (2006.01) | |
| *H10B 43/35* | (2023.01) | |
| *G11C 16/14* | (2006.01) | |
| *H01L 29/78* | (2006.01) | |
| *H01L 29/423* | (2006.01) | |
| *H01L 29/06* | (2006.01) | |

(Continued)

(52) U.S. Cl.
CPC .............. *H10B 43/35* (2023.02); *G11C 16/14* (2013.01); *H01L 29/0649* (2013.01); *H01L 29/42328* (2013.01); *H01L 29/42344* (2013.01); *H01L 29/7851* (2013.01); *H10B 41/10* (2023.02); *H10B 41/35* (2023.02); *H10B 43/10* (2023.02)

(58) Field of Classification Search
CPC ........ G11C 16/14; H01B 43/35; H01B 41/10; H01B 41/35; H01B 43/10; H01L 29/0649; H01L 29/42328; H01L 29/42344; H01L 29/7851
USPC ..................................... 365/185.29
See application file for complete search history.

(56) References Cited

U.S. PATENT DOCUMENTS 7,723,786 B2    5/2010  Kakoschke et al.
7,833,890 B2 *  11/2010 Kim ...................... H01L 29/792
                                              257/E21.573

(Continued)

FOREIGN PATENT DOCUMENTS

TW    201721756    6/2017
TW    201921685    6/2019

OTHER PUBLICATIONS

"Office Action of Taiwan Counterpart Application", dated May 9, 2022, p. 1-p. 3.

*Primary Examiner* — Viet Q Nguyen
(74) *Attorney, Agent, or Firm* — JCIPRNET

(57) ABSTRACT

A memory structure including a substrate, a gate structure, a charge storage layer, and a first control gate is provided. The substrate has a fin portion. A portion of the gate structure is disposed on the fin portion. The gate structure and the fin portion are electrically insulated from each other. The charge storage layer is coupled the gate structure. The charge storage layer and the gate structure are electrically insulated from each other. The first control gate is coupled to the charge storage layer. The first control gate and the charge storage layer are electrically insulated from each other.

19 Claims, 11 Drawing Sheets

(51) Int. Cl.
  *H10B 41/10* (2023.01)
  *H10B 41/35* (2023.01)
  *H10B 43/10* (2023.01)

(56) References Cited

U.S. PATENT DOCUMENTS

| | | | |
|---|---|---|---|
| 9,893,185 B2 * | 2/2018 | Wu | H01L 27/0886 |
| 10,217,872 B2 * | 2/2019 | Kawashima | H01L 29/66833 |
| 10,312,250 B1 | 6/2019 | Tseng et al. | |
| 10,395,742 B2 * | 8/2019 | Saito | H10B 43/30 |
| 10,411,139 B2 * | 9/2019 | Yamashita | H10B 43/30 |
| 10,468,409 B2 * | 11/2019 | Lee | H01L 21/823821 |
| 10,522,545 B2 * | 12/2019 | Chung | H01L 21/823821 |
| 10,580,785 B2 * | 3/2020 | Tsuda | H01L 29/7856 |
| 10,818,679 B2 * | 10/2020 | Hisamoto | H10B 41/30 |
| 10,971,629 B2 * | 4/2021 | Chien | H01L 21/823431 |
| 11,133,326 B2 * | 9/2021 | Takizawa | G11C 16/14 |
| 11,158,648 B2 * | 10/2021 | Huang | H01L 29/7853 |
| 2017/0345941 A1 | 11/2017 | Wu et al. | |
| 2019/0164986 A1 * | 5/2019 | Tsuda | H01L 21/047 |

* cited by examiner

MEMORY STRUCTURE AND OPERATION METHOD THEREOF

CROSS-REFERENCE TO RELATED APPLICATION

This application claims the priority benefit of U.S. provisional patent application Ser. No. 63/078,343, filed on Sep. 15, 2020. The entirety of the above-mentioned patent application is hereby incorporated by reference and made a part of this specification.

BACKGROUND OF THE INVENTION

Field of the Invention

The invention relates to a semiconductor structure and an operation method thereof, and particularly relates to a memory structure and an operation method thereof.

Description of Related Art

Since the non-volatile memory has the advantage that the stored data will not disappear even after being powered off, many electronic products must require this type of memory to maintain normal operation when the electronic products are turned on. However, in the memory that uses the gate (e.g., floating gate) to store charge, since the gate dielectric layer located between the gate and the substrate is usually thin, the charge stored in the gate is easily lost, thereby reducing the data retention capacity of the memory device.

SUMMARY OF THE INVENTION

The invention provides a memory structure and an operation method thereof, which can have the better data retention capacity.

The invention provides a memory structure, which includes a substrate, a gate structure, a charge storage layer, and a first control gate. The substrate has a fin portion. A portion of the gate structure is disposed on the fin portion. The gate structure and the fin portion are electrically insulated from each other. The charge storage layer is coupled the gate structure. The charge storage layer and the gate structure are electrically insulated from each other. The first control gate is coupled to the charge storage layer. The first control gate and the charge storage layer are electrically insulated from each other.

According to an embodiment of the invention, in the memory structure, the charge storage layer is not electrically connected to a voltage source.

According to an embodiment of the invention, in the memory structure, the thickness of the dielectric material between the charge storage layer and the gate structure may be greater than the thickness of the dielectric material between the gate structure and the fin portion.

According to an embodiment of the invention, in the memory structure, the gate structure may include a first gate and a second gate. The first gate is disposed on the fin portion. The first gate and the fin portion may be electrically insulated from each other. The first gate and the second gate may be separated from each other and electrically connected to each other. The charge storage layer is coupled to the second gate. The charge storage layer and the second gate may be electrically insulated from each other.

According to an embodiment of the invention, the memory structure may further include an isolation structure. The isolation structure is disposed on the substrate and is located around the fin portion. The second gate, the charge storage layer, and the first control gate may be disposed on the isolation structure.

According to an embodiment of the invention, in the memory structure, the charge storage layer may be located on one side of the second gate.

According to an embodiment of the invention, in the memory structure, the charge storage layer may be further located on the top surface of the second gate.

According to an embodiment of the invention, in the memory structure, the total coupling area between the first control gate and the charge storage layer may be smaller than the total coupling area between the second gate and the charge storage layer.

According to an embodiment of the invention, the memory structure may include a plurality of the second gates and a plurality of the charge storage layers. The second gates may be electrically connected to each other. The charge storage layers may be electrically connected to each other. The charge storage layers are coupled to the second gates.

According to an embodiment of the invention, in the memory structure, the gate structure may include a gate. The gate is disposed on the fin portion. The gate and the fin portion may be electrically insulated from each other. The charge storage layer may be coupled to the gate. The charge storage layer and the gate may be electrically insulated from each other.

According to an embodiment of the invention, in the memory structure, the charge storage layer may be located on the top surface of the gate.

According to an embodiment of the invention, the memory structure may further include a second control gate. The second control gate is coupled to the charge storage layer. The second control gate and the charge storage layer may be electrically insulated from each other. The total coupling area between the first control gate and the charge storage layer may be smaller than the total coupling area between the second control gate and the charge storage layer.

According to an embodiment of the invention, in the memory structure, the substrate may have a plurality of the fin portions. The first gate may be disposed across the fin portions.

According to an embodiment of the invention, the memory structure may further include a contact. The contact is electrically connected to the doped region in the fin portion. The contact and the charge storage layer may be derived from the same material layer.

According to an embodiment of the invention, the memory structure may further include a select gate. The select gate is disposed on the fin portion on one side of the first gate. The select gate and the fin portion may be electrically insulated from each other.

According to an embodiment of the invention, the memory structure may further include a second control gate. The second control gate is coupled to the charge storage layer. The second control gate and the charge storage layer may be electrically insulated from each other.

According to an embodiment of the invention, the memory structure may further include a coupling gate. The coupling gate is coupled to the charge storage layer. The coupling gate and charge storage layer may be electrically insulated from each other.

According to an embodiment of the invention, in the memory structure, the total coupling area between the first control gate and the charge storage layer may be smaller than the total coupling area between the coupling gate and the charge storage layer.

The invention provides an operation method of a memory structure, which includes performing the program operation on the memory structure. The program operation may include the following step. The charge is injected into the charge storage layer from the first control gate.

The invention provides an operation method of a memory structure, which includes performing the erase operation on the memory structure. The erase operation may include the following step. The charge is ejected from the charge storage layer through the first control gate.

Based on the above description, in the memory structure and the operation method thereof according to the invention, since the charge can be stored in the charge storage layer coupled to the gate structure, the loss of the charge stored in the charge storage layer can be prevented, thereby improving the data retention capacity of the memory device.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
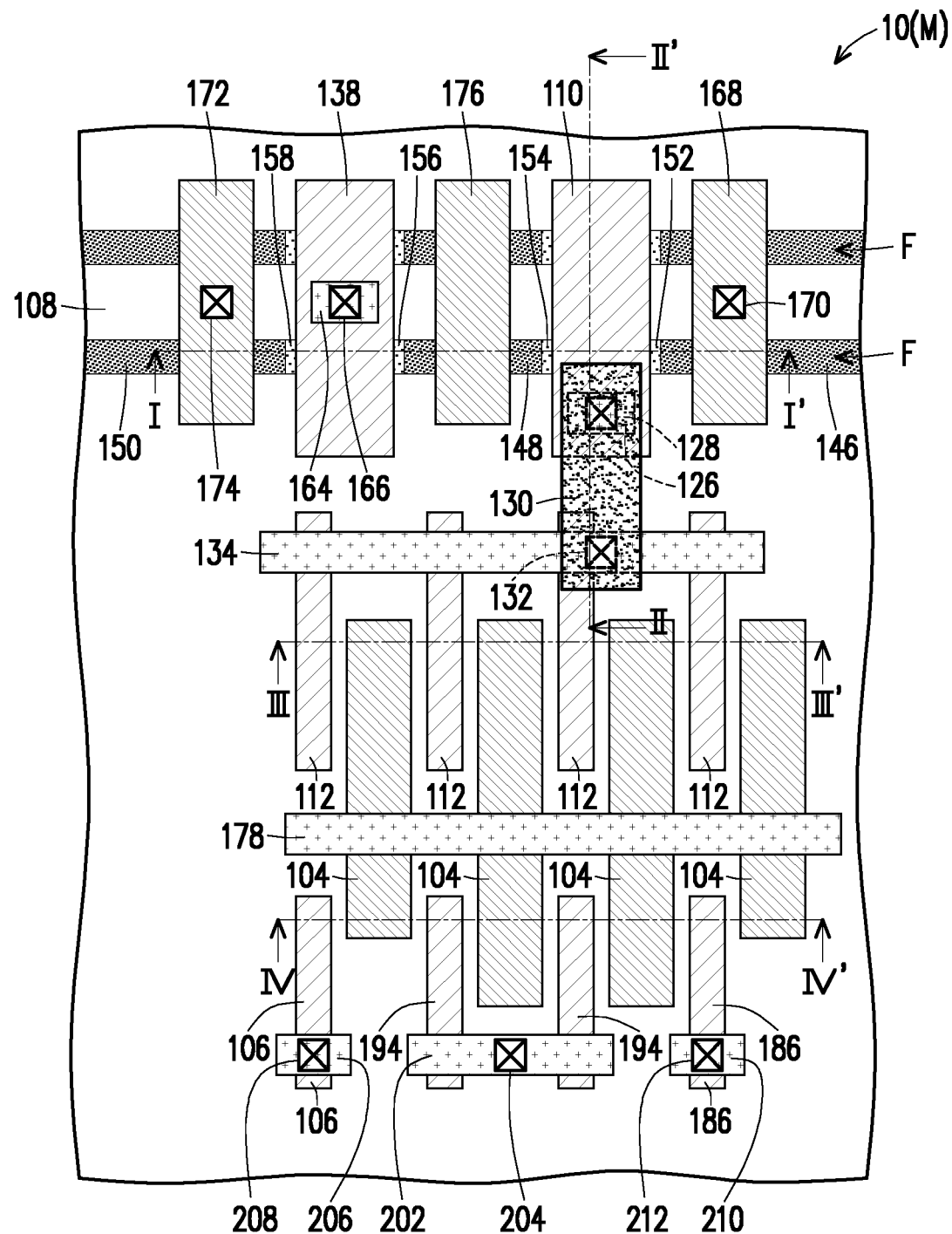
FIG. 1A is a top view illustrating a memory structure according to an embodiment of the invention.
Figure 1B:
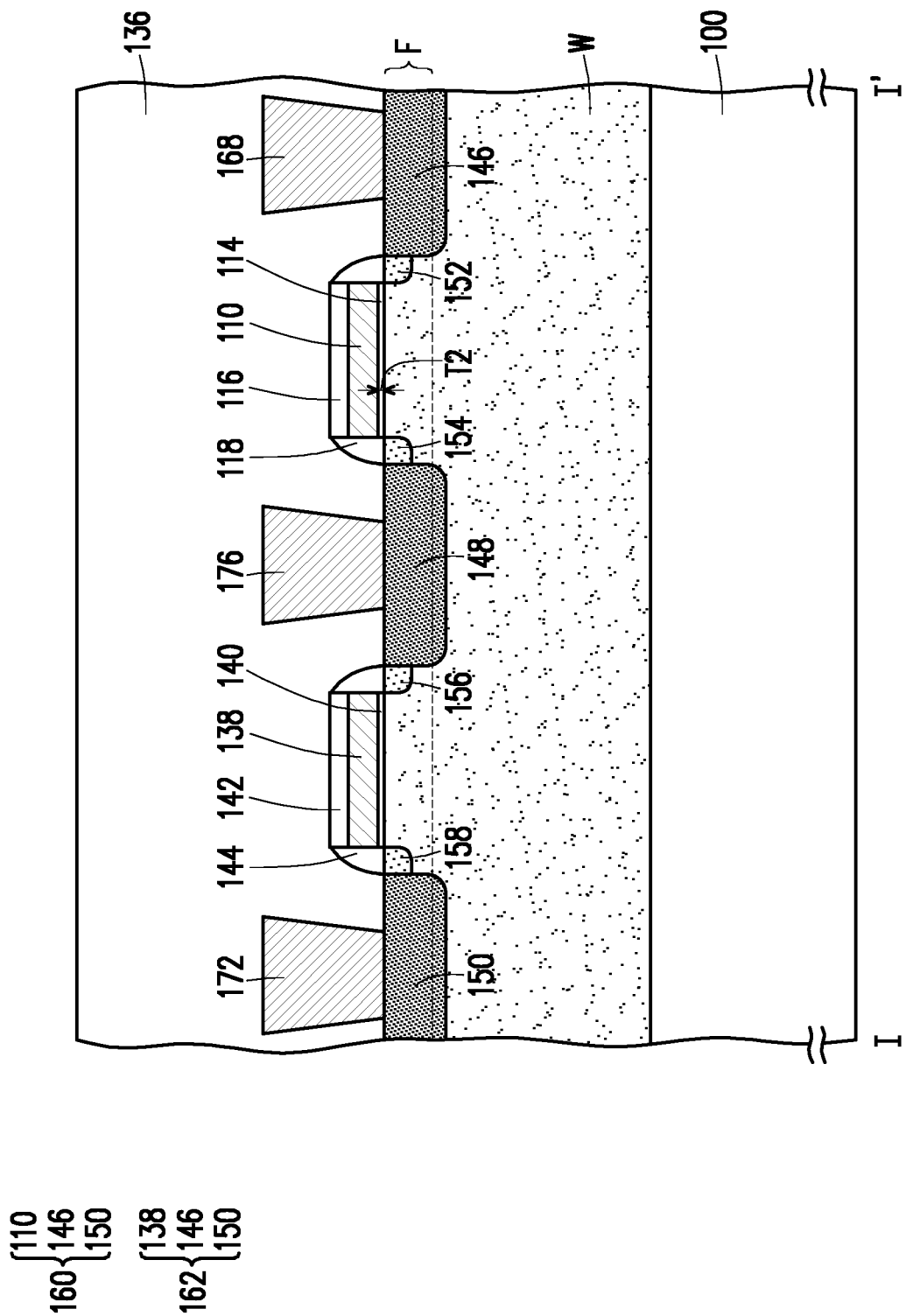
FIG. 1B is a cross-sectional view taken along section line I-I' in FIG. 1A.
Figure 1C:
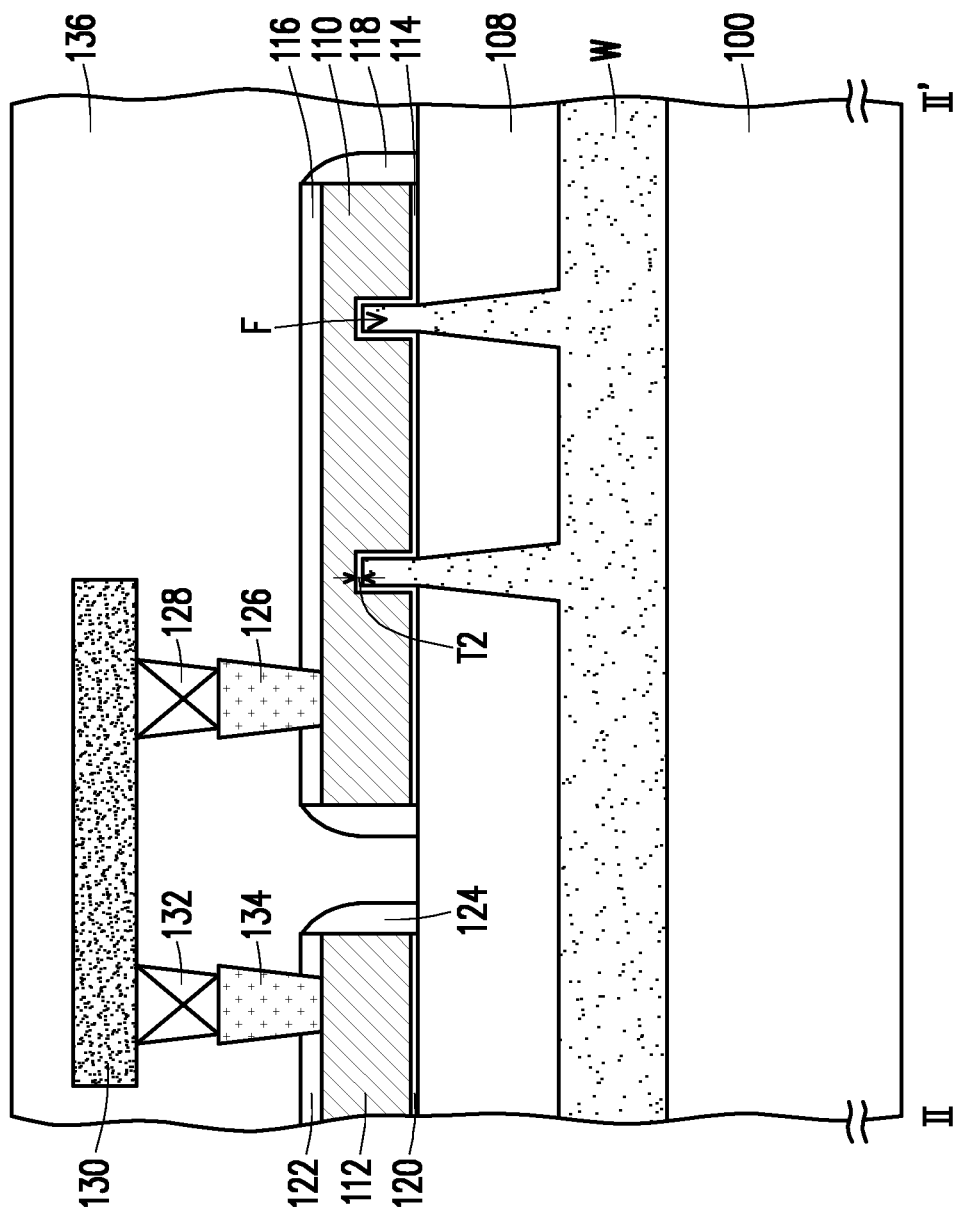
FIG. 1C is a cross-sectional view taken along section line II-II' in FIG. 1A.
Figure 1D:
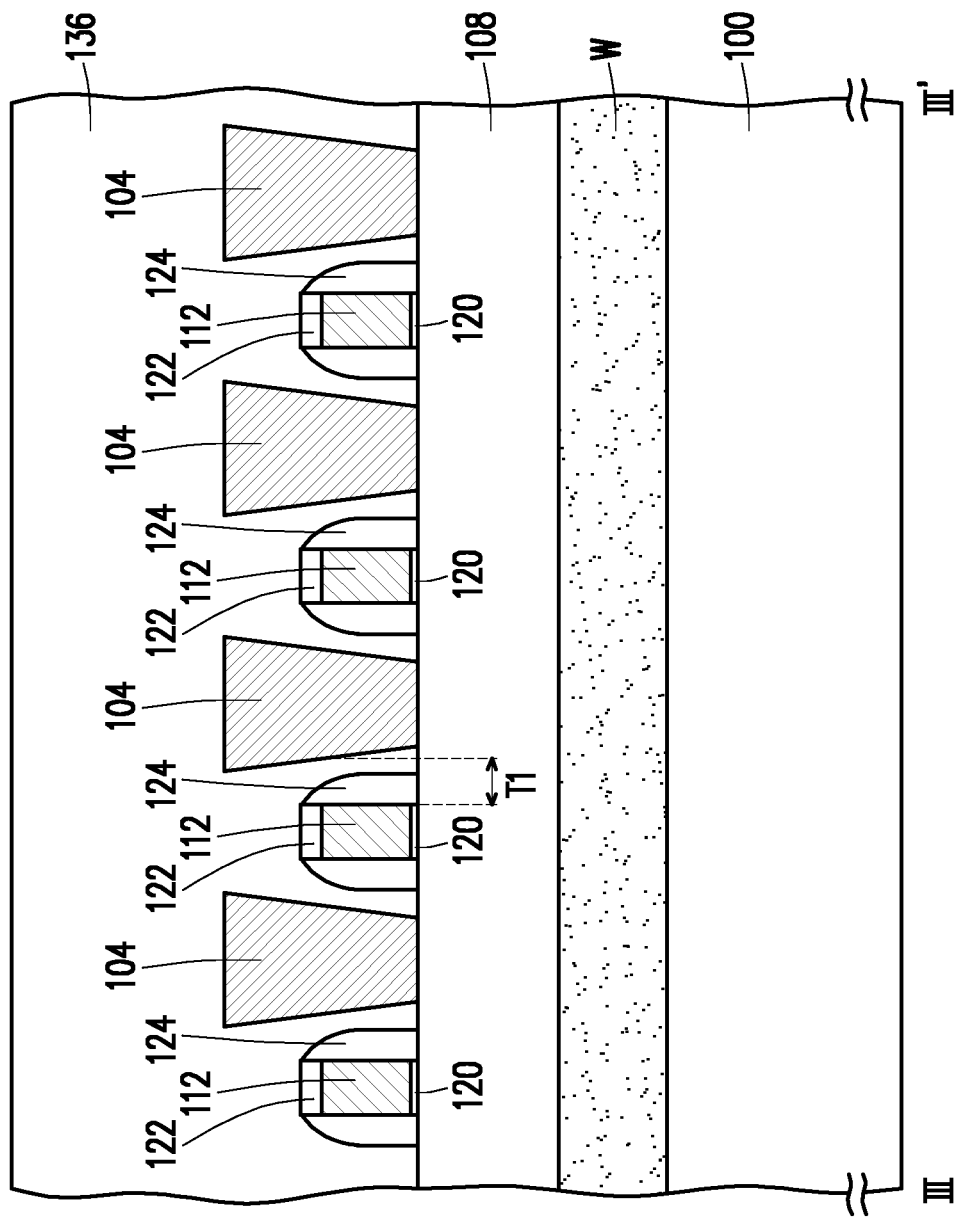
FIG. 1D is a cross-sectional view taken along section line III-III' in FIG. 1A.
Figure 1E:
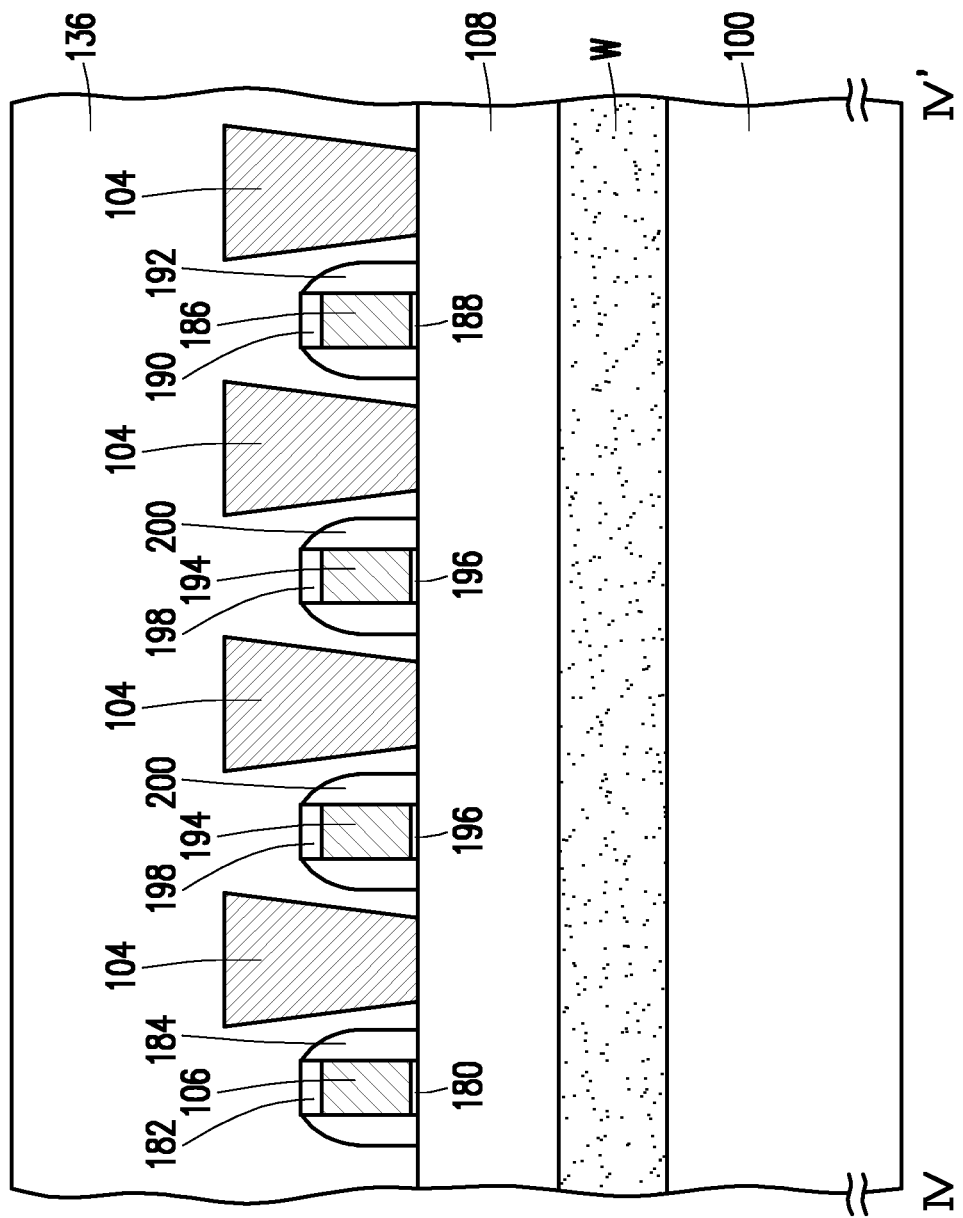
FIG. 1E is a cross-sectional view taken along section line IV-IV' in FIG. 1A.
Figure 2:
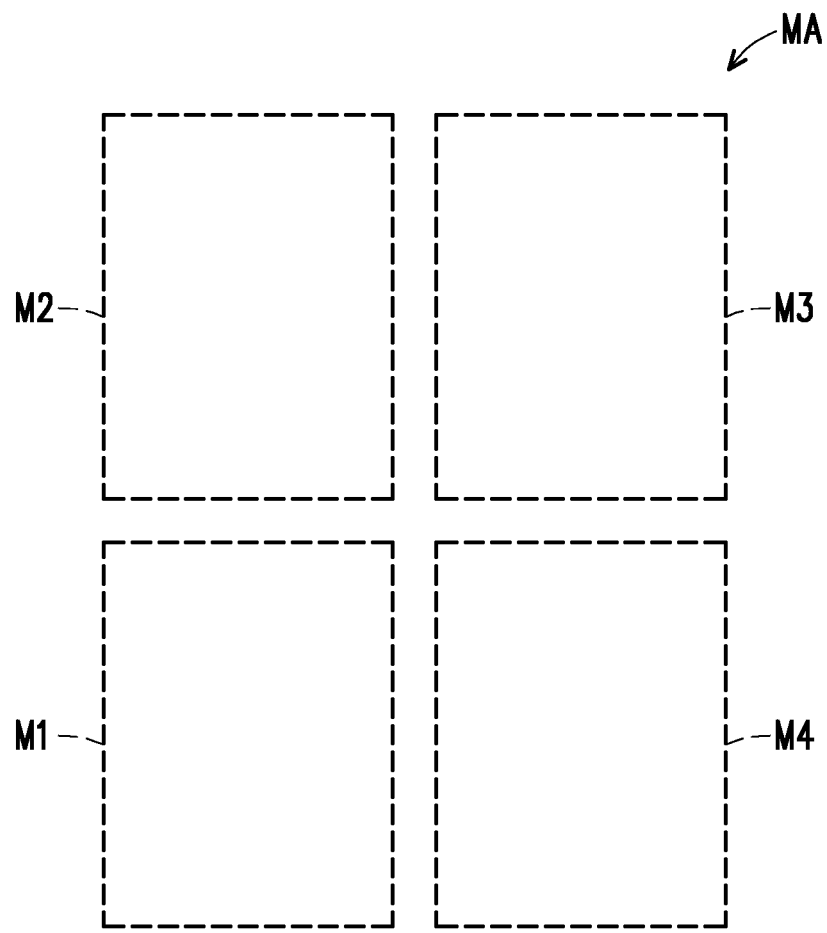
FIG. 2 is a schematic view illustrating a memory cell array according to an embodiment of the invention.

FIG. 1A is a top view illustrating a memory structure according to an embodiment of the invention. In FIG. 1A, some of the components in FIG. 1B to FIG. 1E are omitted to clearly describe the configuration relationship between the components in FIG. 1A. FIG. 1B is a cross-sectional view taken along section line I-I' in FIG. 1A. FIG. 1C is a cross-sectional view taken along section line II-II' in FIG. 1A. FIG. 1D is a cross-sectional view taken along section line III-III' in FIG. 1A. FIG. 1E is a cross-sectional view taken along section line IV-IV' in FIG. 1A. FIG. 2 is a schematic view illustrating a memory cell array according to an embodiment of the invention.

Referring to FIG. 1A to FIG. 1E, the memory structure 10 includes a substrate 100, a gate structure 102, a charge storage layer 104, and a control gate 106. In some embodiments, the memory structure 10 may be a non-volatile memory. The substrate 100 has a fin portion F. The memory structure 10 may be integrated with the fin field effect transistor (FinFET) process. The fin portion may be used as the active region of the memory device. In the present embodiment, the substrate 100 has, for example, a plurality of fin portions F, but the invention is not limited thereto. As long as the number of fin portions F is at least one, it falls within the scope of the invention. In addition, the memory structure 10 may further include an isolation structure 108. The isolation structure 108 is disposed on the substrate 100 and is located around the fin portion F. As shown in FIG. 1C, the top surface of the fin portion F may be higher than the top surface of the isolation structure 108. In some embodiments, the isolation structure 108 may be a shallow trench isolation (STI) structure. The material of the isolation structure 108 is, for example, silicon oxide.

Referring to FIG. 1A to FIG. 1C, a portion of the gate structure 102 is disposed on the fin portion F. The gate structure 102 and the fin portion F are electrically insulated from each other. The gate structure 102 is not electrically connected to a voltage source. In the present embodiment, the gate structure 102 may include a gate 110 and a gate 112. A portion of the gate 110 is disposed on the fin portion F. The gate 110 and the fin portion F may be electrically insulated from each other. In some embodiments, the gate 110 may be disposed across the plurality of the fin portions F. Furthermore, a portion of the gate 110 may be disposed on the isolation structure 108. The gate 110 may be a metal gate. The material of the gate 110 may include a conductive material such as tungsten or titanium nitride (TiN).

Moreover, as shown in FIG. 1B and FIG. 1C, the memory structure 10 may further include at least one of a dielectric layer 114, a cap layer 116, and a spacer 118. The dielectric layer 114 is disposed between the gate 110 and the fin portion F, so that the gate 110 and the fin portion F may be electrically insulated from each other. The material of the dielectric layer 114 is, for example, a dielectric material such as silicon oxide or a high dielectric constant (high-k) material. In some embodiments, the gate 110 and the dielectric layer 114 may be formed by high-k metal gate (HKMG) technology, but the invention is not limited thereto. In some embodiments, a work function layer (not shown) may be disposed between the gate 110 and the dielectric layer 114. In some embodiments, the cap layer 116 may be disposed on the top surface of the gate 110, but the invention is not limited thereto. In other embodiments, the cap layer 116 on the top surface of the gate 110 may be omitted. The material of the cap layer 116 is, for example, a dielectric material such as silicon oxide or silicon nitride. The spacer 118 may be disposed on the sidewall of the gate 110. The spacer 118 may be a single-layer structure or a multilayer structure. The material of the spacer 118 is, for example, a dielectric material such as silicon oxide or silicon nitride.

The gate 112 may be disposed on the isolation structure 108. The gate 110 and the gate 112 may be separated from each other and electrically connected to each other. In addition, the gate 112 may not be disposed across the fin portion F. The gate 112 may be used as an extension portion of the gate 110.

As shown in FIG. 1D, the memory structure 10 may further include at least one of a dielectric layer 120, a cap layer 122, and a spacer 124. The dielectric layer 120 may be disposed between the gate 112 and the isolation structure 108. The gate 112 may be a metal gate. The material of the gate 112 may include a conductive material such as tungsten or titanium nitride (TiN). The material of the dielectric layer 120 is, for example, a dielectric material such as silicon oxide or a high-k material. In some embodiments, the gate 112 and the dielectric layer 120 may be formed by high-k metal gate (HKMG) technology, but the invention is not limited thereto. In some embodiments, a work function layer (not shown) may be disposed between the gate 112 and the dielectric layer 120. In some embodiments, the cap layer 122 may be disposed on the top surface of the gate 112, but the invention is not limited thereto. In other embodiments, the cap layer 122 on the top surface of the gate 112 may be omitted. The material of the cap layer 122 is, for example, a dielectric material such as silicon oxide or silicon nitride. The spacer 124 may be disposed on the sidewall of the gate 112. The spacer 124 may be a single-layer structure or a multilayer structure. The material of the spacer 124 is, for example, a dielectric material such as silicon oxide or silicon nitride.

As shown in FIG. 1A and FIG. 1C, the memory structure 10 may further include a contact 126, a contact via 128, a conductive line 130, a contact via 132, and a contact 134. In the present embodiment, the contact 126 may pass through the cap layer 116 to be electrically connected to the gate 110, and the contact 134 may pass through the cap layer 122 to be electrically connected to the gate 112, and the gate 110 may be electrically connected to the gate 112 by the contact 126, the contact via 128, the conductive line 130, the contact via 132, and the contact 134 are electrically connected to the gate 112, but the invention is not limited thereto. In some embodiments, the materials of the contact 126, the contact via 128, the conductive line 130, the contact via 132, and the contact 134 are, for example, conductive materials such as tungsten, aluminum, or copper. In addition, the memory structure 10 may further include a dielectric layer 136. The contact 126, the contact via 128, the conductive line 130, the contact via 132, and the contact 134 may be located in the dielectric layer 136. In some embodiments, the dielectric layer 136 may be a multilayer structure. The material of the dielectric layer 136 is, for example, silicon oxide, silicon nitride, or a combination thereof.

Furthermore, the number and shape of the gate 112 may be flexibly adjusted according to the product requirement. In the present embodiment, the memory structure 10 may include a plurality of the gates 112, and the number of gates 112 is not limited to the number shown in the figure. As long as the number of gates 112 is at least one, it falls within the scope of the invention. The gates 112 may be electrically connected to each other. For example, the gates 112 may be electrically connected to each other by the contact 134. The contact 134 may be a slot contact.

Referring to FIG. 1A and FIG. 1B, the memory structure 10 may further include a select gate 138. The select gate 138 is disposed on the fin portion F on one side of the gate 110. The select gate 138 and the fin portion F are electrically insulated from each other. In some embodiments, the select gate 138 may be disposed across the fin portions F.

In addition, as shown in FIG. 1B, the memory structure 10 may further include at least one of a dielectric layer 140, a cap layer 142, and a spacer 144. The dielectric layer 140 is disposed between the select gate 138 and the fin portion F, so that the select gate 138 and the fin portion F may be electrically insulated from each other. Furthermore, a portion of the select gate 138 may be disposed on the isolation structure 108 (FIG. 1A). The select gate 138 may be as a metal gate. In other embodiments, the select gate 138 may be a polysilicon gate. The material of the gate 138 may include a conductive material such as tungsten or titanium nitride (TiN). The material of the dielectric layer 140 is, for example, a dielectric material such as silicon oxide or a high-k material. In some embodiments, the select gate 138 and the dielectric layer 140 may be formed by high-k metal gate (HKMG) technology, but the invention is not limited thereto. In some embodiments, a work function layer (not shown) may be disposed between the select gate 138 and the dielectric layer 140. In some embodiments, the cap layer 142 may be disposed on the top surface of the select gate 138, but the invention is not limited thereto. In other embodiments, the cap layer 142 on the top surface of the select gate 138 may be omitted. The material of the cap layer 142 is, for example, a dielectric material such as silicon oxide or silicon nitride. The spacer 144 may be disposed on the sidewall of the select gate 138. The spacer 144 may be a single-layer structure or a multilayer structure. The material of the spacer 144 is, for example, a dielectric material such as silicon oxide or silicon nitride.

Referring to FIG. 1A and FIG. 1B, the memory structure 10 may further include a doped region 146, a doped region 148, and a doped region 150. The doped region 146 and the doped region 148 may be located on two sides of the gate 110. For example, the doped region 146 and the doped region 148 may be located in the fin portion F on two sides of the gate 110. The doped region 148 and the doped region 150 may be located on two sides of the select gate 138. For example, the doped region 148 and the doped region 150 may be located in the fin portion F on two sides of the select gate 138. In addition, the doped region 148 may be located between the gate 110 and the select gate 138. For example, the doped region 148 may be located in the fin portion F between the gate 110 and the select gate 138. Furthermore, the memory structure 10 may further include a lightly doped drain (LDD) 152, an LDD 154, an LDD 156, and an LDD 158. The LDD 152 may be located in the fin portion F between the doped region 146 and the gate 110. The LDD 154 may be located in the fin portion F between the doped region 148 and the gate 110. The LDD 156 may be located in the fin portion F between the doped region 148 and the select gate 138. The LDD electrode 158 may be located in the fin portion F between the doped region 150 and the select gate 138. In addition, the memory structure 10 may further include a well region W. The well region W may be located in substrate 100. In addition, the doped region 146, the doped region 148, the doped region 150, the LDD 152, the LDD 154, the LDD 156, and the LDD 158 may be located in the well region W.

The doped region 146, the doped region 148, the doped region 150, the LDD 152, the LDD 154, the LDD 156, and the LDD 158 may have a first conductive type, and the well region W may have a second conductive type. The first conductive type and the second conductive type are different conductive types. That is, the first conductive type and the second conductive type may be one and the other of the N-type conductive type and the P-type conductive type, respectively.

In other embodiments, the doped region 146, the doped region 148, and the doped region 150 may be strained regions formed of a strained material, and the LDD 152, the LDD 154, LDD 156, and LDD 158 may be omitted. Taking the material suitable for the P-type metal oxide semiconductor transistor as an example, the strained material may be a material containing germanium such as silicon germanium (SiGe). The doped region 146, the doped region 148, and the doped region 150 may be formed by epitaxial growth technology such as selective epitaxial growth (SEG).

The transistor 160 at least includes the gate 110, the doped region 146, and the doped region 150. The select transistor 162 at least includes the select gate 138, the doped region 146, and the doped region 150. When the transistor 160 and the select transistor 162 are N-type metal oxide semiconductor transistors (NMOS transistors), the first conductive type is N-type, and the second conductive type is P-type. When the transistor 160 and the select transistor 162 are P-type metal oxide semiconductor transistors (PMOS transistors), the first conductive type is P-type, and the second conductive type is N-type. Moreover, the transistor 160 and the select transistor 162 may be fin field effect transistors (FinFETs), respectively.

In some embodiments, the memory structure 10 may further include at least one of a contact 164, a contact via 166, a contact 168, a contact via 170, a contact 172, a contact via 174, and a contact 176. The select gate 138 may be electrically connected to a word line by the contact 164 and the contact via 166. The contact 168, the contact 172, and the contact 176 may be electrically connected to the doped region 146, the doped region 150, and the doped region 148 in the fin portion F, respectively. The contact 168, the contact 172, the contact 176, and the charge storage layer 104 may be derived from the same material layer. That is, the contact 168, the contact 172, the contact 176, and the charge storage layer 104 may be simultaneously formed by the same manufacturing process. In other words, the charge storage layer 104 may be regarded as one kind of contact under the FinFET process platform, and the contact is used to store charge. In some embodiments, the doped region 146 may be electrically connected to a bit line by the contact 168 and the contact via 170. In some embodiments, the doped region 150 may be electrically connected to a source line by the contact 172 and the contact via 174. In addition, the contact 176 may be connected to the doped region 148. The contact 168, the contact 172, and the contact 176 may be slot contacts. The materials of the contact 164, the contact via 166, the contact 168, the contact via 170, the contact 172, the contact via 174, and the contact 176 are, for example, conductive materials such as tungsten, aluminum, or copper.

Referring to FIG. 1A and FIG. 1D, the charge storage layer 104 is adjacent to (coupled to) the gate structure 102. For example, the charge storage layer 104 is adjacent to (coupled to) the gate 112. The charge storage layer 104 is not electrically connected to a voltage source. The charge storage layer 104 may be located on one side of the gate 112. The charge storage layer 104 may be disposed on the isolation structure 108. Furthermore, the vertical projection of the charge storage layer 104 on the isolation structure 108 may not overlap the vertical projection of the gate 112 on the isolation structure 108. Moreover, the charge storage layer 104 and the gate structure 102 are electrically insulated from each other. For example, the charge storage layer 104 and the gate 112 may be electrically insulated from each other by the dielectric layer 136 and the spacer 124.

In the present embodiment, the memory structure 10 may include a plurality of the charge storage layers 104, and the number of charge storage layers 104 is not limited to the number shown in the figure. As long as the number of charge storage layers 104 is at least one, it falls within the scope of the invention. In addition, the number of charge storage layers 104 and the number of gates 112 are related to each other, and the number of charge storage layers 104 and the number of gates 112 may affect the total coupling area between the gate 112 and the charge storage layer 104. The greater the total coupling area, the more charge can be injected into or ejected from the charge storage layer 104, thereby helping to improve the operating performance of the memory device. Therefore, the number and shape of the charge storage layer 104 may be flexibly adjusted according to the product requirement. Furthermore, when the number of charge storage layers 104 is multiple, the charge storage layers 104 may be electrically connected to each other. For example, the memory structure 10 may further include a contact 178. The charge storage layers 104 may be electrically connected to each other by the contact 178. The charge storage layer 104 and the contact 178 may be integrally formed or separate components. The material of the contact 178 is, for example, a conductive material such as tungsten, aluminum, or copper.

Referring to FIG. 1B to FIG. 1D, the thickness T1 (FIG. 1D) of the dielectric material (e.g., dielectric layer 136 and spacer 124) between the charge storage layer 104 and the gate structure 102 (e.g., gate 112) may be greater than the thickness T2 (FIG. 1B and FIG. 1C) of the dielectric material (e.g., dielectric layer 114) between the gate structure 102 (e.g., gate 110) and the fin portion F. That is, the dielectric material between the charge storage layer 104 and the gate structure 102 may have a greater thickness, so that the loss of the charge stored in the charge storage layer 104 can be prevented, thereby improving the data retention capacity of the memory device.

Referring to FIG. 1A and FIG. 1E, the control gate 106 is adjacent to (coupled to) the charge storage layer 104. For example, the control gate 106 may be located on one side of the charge storage layer 104. The control gate 106 and the charge storage layer 104 are electrically insulated from each other. The control gate 106 may be disposed on the isolation structure 108. Moreover, the vertical projection of the control gate 106 on the isolation structure 108 may not overlap the vertical projection of the charge storage layer 104 on the isolation structure 108. In addition, the total coupling area between the control gate 106 and the charge storage layer 104 may be smaller than the total coupling area between the gate 112 and the charge storage layer 104, thereby helping to improve the operating performance of the memory device.

Furthermore, as shown in FIG. 1E, the memory structure 10 may further include at least one of a dielectric layer 180, a cap layer 182, and a spacer 184. The dielectric layer 180 may be disposed between the control gate 106 and the isolation structure 108. The control gate 106 may be a metal gate. The material of the control gate 106 may include a conductive material such as tungsten or titanium nitride (TiN). The material of the dielectric layer 180 is, for example, a dielectric material such as silicon oxide or a high-k material. In some embodiments, the control gate 106 and the dielectric layer 180 may be formed by high-k metal gate (HKMG) technology, but the invention is not limited thereto. In some embodiments, a work function layer (not shown) may be disposed between the control gate 106 and the dielectric layer 180. In some embodiments, the cap layer 182 may be disposed on the top surface of the control gate 106, but the invention is not limited thereto. In other embodiments, the cap layer 182 on the top surface of the control gate 106 may be omitted. The material of the cap layer 182 is, for example, a dielectric material such as silicon oxide or silicon nitride. The spacer 184 may be disposed on the sidewall of the control gate 106. The spacer 184 may be a single-layer structure or a multilayer structure. The material of the spacer 184 is, for example, a dielectric material such as silicon oxide or silicon nitride. In addition, the control gate 106 and the charge storage layer 104 may be electrically insulated from each other by the dielectric layer 136 and the spacer 184.

Referring to FIG. 1A and FIG. 1E, the memory structure 10 may further include a control gate 186. The control gate 186 is adjacent to (coupled to) the charge storage layer 104. For example, the control gate 186 may be located on one side of the charge storage layer 104. The control gate 186 and the charge storage layer 104 are electrically insulated from each other. The control gate 186 may be disposed on the isolation structure 108. In addition, the vertical projection of the control gate 186 on the isolation structure 108 may not overlap with the vertical projection of the charge storage layer 104 on the isolation structure 108. Furthermore, the total coupling area between the control gate 186 and the charge storage layer 104 may be smaller than the total coupling area between the gate 112 and the charge storage layer 104, thereby helping to improve the operating performance of the memory device.

Moreover, as shown in FIG. 1E, the memory structure 10 may further include at least one of a dielectric layer 188, a cap layer 190, and a spacer 192. The dielectric layer 188 may be disposed between the control gate 186 and the isolation structure 108. The control gate 186 may be a metal gate. The material of the control gate 186 may include a conductive material such as tungsten or titanium nitride (TiN). The material of the dielectric layer 188 is, for example, a dielectric material such as silicon oxide or a high-k material. In some embodiments, the control gate 186 and the dielectric layer 188 may be formed by high-k metal gate (HKMG) technology, but the invention is not limited thereto. In some embodiments, a work function layer (not shown) may be disposed between the control gate 186 and the dielectric layer 188. In some embodiments, the cap layer 190 may be disposed on the top surface of the control gate 186, but the invention is not limited thereto. In other embodiments, the cap layer 190 on the top surface of the control gate 186 may be omitted. The material of the cap layer 190 is, for example, a dielectric material such as silicon oxide or silicon nitride. The spacer 192 may be disposed on the sidewall of the control gate 186. The spacer 192 may be a single-layer structure or a multilayer structure. The material of the spacer 192 is, for example, a dielectric material such as silicon oxide or silicon nitride. In addition, the control gate 186 and the charge storage layer 104 may be electrically insulated from each other by the dielectric layer 136 and the spacer 192.

The control gate 106 and the control gate 186 may be used as one and the other of the erase gate and the program gate, respectively, but the invention is not limited thereto. In other embodiments, the control gate 186 may be omitted. When the control gate 186 is omitted, the control gate 106 may be used as the erase gate in the erase operation and may be used as the program gate in the program operation. In the present embodiment, the control gate 106 is used, for example, as the erase gate, and the control gate 186 is used, for example, as the program gate, but the invention is not limited thereto. In the present embodiment, the memory structure 10 includes the control gate 106 and the control gate 186, and the control gate 106 and the control gate 186 may be used as the erase gate and the program gate, respectively, thereby helping to reduce the complexity of circuit design.

Referring to FIG. 1A and FIG. 1E, the memory structure 10 may further include a coupling gate 194. The coupling gate 194 is adjacent to (coupled to) the charge storage layer 104. For example, the coupling gate 194 may be located on one side of the charge storage layer 104. The coupling gate 194 and the charge storage layer 104 are electrically insulated from each other. In some embodiments, the coupling gate 194 may be used to perform an erase inhibit operation to prevent the memory cell that is not selected for erasing from being erased. In some embodiments, the coupling gate 194 may be used to perform a program inhibit operation to prevent the memory cell that is not selected for programming from being programmed. The coupling gate 194 may be disposed on the isolation structure 108, and the vertical projection of the coupling gate 194 on the isolation structure 108 may not overlap the vertical projection of the charge storage layer 104 on the isolation structure 108. Furthermore, the total coupling area between the control gate 106 and the charge storage layer 104 may be smaller than the total coupling area between the coupling gate 194 and the charge storage layer 104, thereby helping to improve the operating performance of the memory device. Moreover, the total coupling area between the control gate 186 and the charge storage layer 104 may be smaller than the total coupling area between the coupling gate 194 and the charge storage layer 104, thereby helping to improve the operating performance of the memory device.

In addition, as shown in FIG. 1E, the memory structure 10 may further include at least one of a dielectric layer 196, a cap layer 198, and a spacer 200. The dielectric layer 196 may be disposed between the coupling gate 194 and the isolation structure 108. The coupling gate 194 may be a metal gate. The material of the coupling gate 194 may include a conductive material such as tungsten or titanium nitride (TiN). The material of the dielectric layer 196 is, for example, a dielectric material such as silicon oxide or a high-k material. In some embodiments, the coupling gate 194 and the dielectric layer 196 may be formed by high-k metal gate (HKMG) technology, but the invention is not limited thereto. In some embodiments, a work function layer (not shown) may be disposed between the coupling gate 194 and the dielectric layer 196. In some embodiments, the cap layer 198 may be disposed on the top surface of the coupling gate 194, but the invention is not limited thereto. In other embodiments, the cap layer 198 on the top surface of the coupling gate 194 may be omitted. The material of the cap layer 198 is, for example, a dielectric material such as silicon oxide or silicon nitride. The spacer 200 may be disposed on the sidewall of the coupling gate 194. The spacer 200 may be a single-layer structure or a multilayer structure. The material of the spacer 200 is, for example, a dielectric material such as silicon oxide or silicon nitride. Furthermore, the coupling gate 194 and the charge storage layer 104 may be electrically insulated from each other by the dielectric layer 136 and the spacer 200.

In the present embodiment, the memory structure 10 may include a plurality of coupling gates 194, and the number of coupling gates 194 is not limited to the number shown in the figure. As long as the number of coupling gates 194 is at least one, it falls within the scope of the invention. In some embodiments, the coupling gates 194 may be electrically connected to each other. In some embodiments, the memory structure 10 may further include at least one of a contact 202, a contact via 204, a contact 206, a contact via 208, a contact 210, and a contact via 212. The coupling gates 194 may be electrically connected to each other by the contact 202. The contact 202 may be a slot contact. Moreover, the coupling gate 194 may be electrically connected to the corresponding voltage source by the contact 202 and the contact via 204. The control gate 106 may be electrically connected to the corresponding voltage source by the contact 206 and the contact via 208. The control gate 186 may be electrically connected to the corresponding voltage source by the contact 210 and the contact via 212. The material of the contact 202, the contact via 204, the contact 206, the contact via 208, the contact 210, and the contact via 212 are, for example, conductive materials such as tungsten, aluminum, or copper.

Hereinafter, the operation method of the memory structure 10 is described with reference to FIG. 1A, FIG. 2, Table 1 and Table 2.

In the present embodiment, the memory structure 10 shown in FIG. 1A is used as a memory cell M. In FIG. 2, the memory cell array MA includes, for example, a memory cell M1, a memory cell M2, a memory cell M3, and a memory cell M4, but the invention is not limited thereto. The memory cell M1, the memory cell M2, the memory cell M3, and the memory cell M4 are coupled to each other. In addition, the memory cell M1, the memory cell M2, the memory cell M3, and the memory cell M4 may respectively have the structure of the memory cell M in FIG. 1 and may be mirror images of each other.

The operation method of the memory structure 10 includes performing a program operation on the memory structure 10. The program operation may include the following step. The charge (e.g., electron) is injected into the charge storage layer 104. For example, the charge may be injected into the charge storage layer 104 from the control gate 186 or the control gate 106 by the FN tunneling (Fowler-Nordheim tunneling) method. In addition, the operation method of the memory structure 10 includes performing an erase operation on the memory structure 10. The erase operation may include the following step. The charge (e.g., electrons) is ejected from the charge storage layer 104. For example, the charge may be ejected from the charge storage layer 104 through the control gate 186 or the control gate 106 by the FN tunneling method.

For example, when the transistor 160 and the select transistor 162 are the NMOS transistors, the voltage application method when operating the memory structure 10 is shown in Table 1 below. According to the voltage application method in Table 1, when the erase operation is performed on the memory cell M1, the erase inhibit operation may be performed on the memory cell M2, the memory cell M3, and the memory cell M4 to prevent the memory cell M2, the memory cell M3, and the memory cell M4 from being erased. In addition, according to the voltage application method in Table 1, the program operation may be simultaneously performed on the memory cell M1, the memory cell M2, the memory cell M3, and the memory cell M4. Furthermore, according to the voltage application method in Table 1, the read operation may be performed on the selected memory cell (e.g., memory cell M1).

TABLE 1

|  | memory cell M1 erase operation | memory cell M2 erase inhibit | memory cell M3 erase inhibit | memory cell M4 erase inhibit | program operation | read operation |
| --- | --- | --- | --- | --- | --- | --- |
| P-type well | 0 | 0 | 0 | 0 | 0 | 0 |
| source line | 0 | 0 | 0 | 0 | 0 | 0 |
| bit line | 0 | 3.5 | 3.5 | 0 | 0 | 0.8 |
| word line | 0 | 0 | 0 | 0 | 0 | 0.8 |
| coupling gate | 0 | 0 | 3.5 | 3.5 | 0 | 0.8 |
| program gate | 0 | 0 | 0 | 0 | −12 | 0.8 |
| erase gate | 12 | 12 | 12 | 12 | 0 | 0.8 |
| voltage application time | 10 ms | — | — | — | 10 ms | — |

For example, when the transistor 160 and the select transistor 162 are the PMOS transistors, the voltage application method when operating the memory structure 10 is shown in Table 2 below. According to the voltage application method in Table 2, when the program operation is performed on the memory cell M1, the program inhibit operation may be performed on the memory cell M2, the memory cell M3, and the memory cell M4 to prevent the memory cell M2, the memory cell M3, and the memory cell M4 from being programmed. In addition, according to the voltage application method in Table 2, the erase operation may be simultaneously performed on the memory cell M1, the memory cell M2, the memory cell M3, and the memory cell M4. Furthermore, according to the voltage application method in Table 2, the read operation may be performed on the selected memory cell (e.g., memory cell M1).

TABLE 2

|  | memory cell M1 program operation | memory cell M2 program inhibit | memory cell M3 program inhibit | memory cell M4 program inhibit | erase operation | read operation |
| --- | --- | --- | --- | --- | --- | --- |
| N-type well | 0 | 0 | 0 | 0 | 0 | 0.8 |
| source line | 0 | 0 | 0 | 0 | 0 | 0.8 |
| bit line | 0 | −3.5 | −3.5 | 0 | 0 | 0 |
| word line | 0 | 0 | 0 | 0 | 0 | 0 |
| coupling gate | 0 | 0 | −3.5 | −3.5 | 0 | 0 |
| program gate | −12 | −12 | −12 | −12 | 0 | 0 |
| erase gate | 0 | 0 | 0 | 0 | 12 | 0 |
| voltage application time | 10 ms | — | — | — | 10 ms | — |

Based on the above embodiment, in the memory structure 10 and the operation method thereof, since the charge can be stored in the charge storage layer 104 coupled to the gate structure 102, the loss of the charge stored in the charge storage layer 104 can be prevented, thereby improving the data retention capacity of the memory device.

Figure 3A:
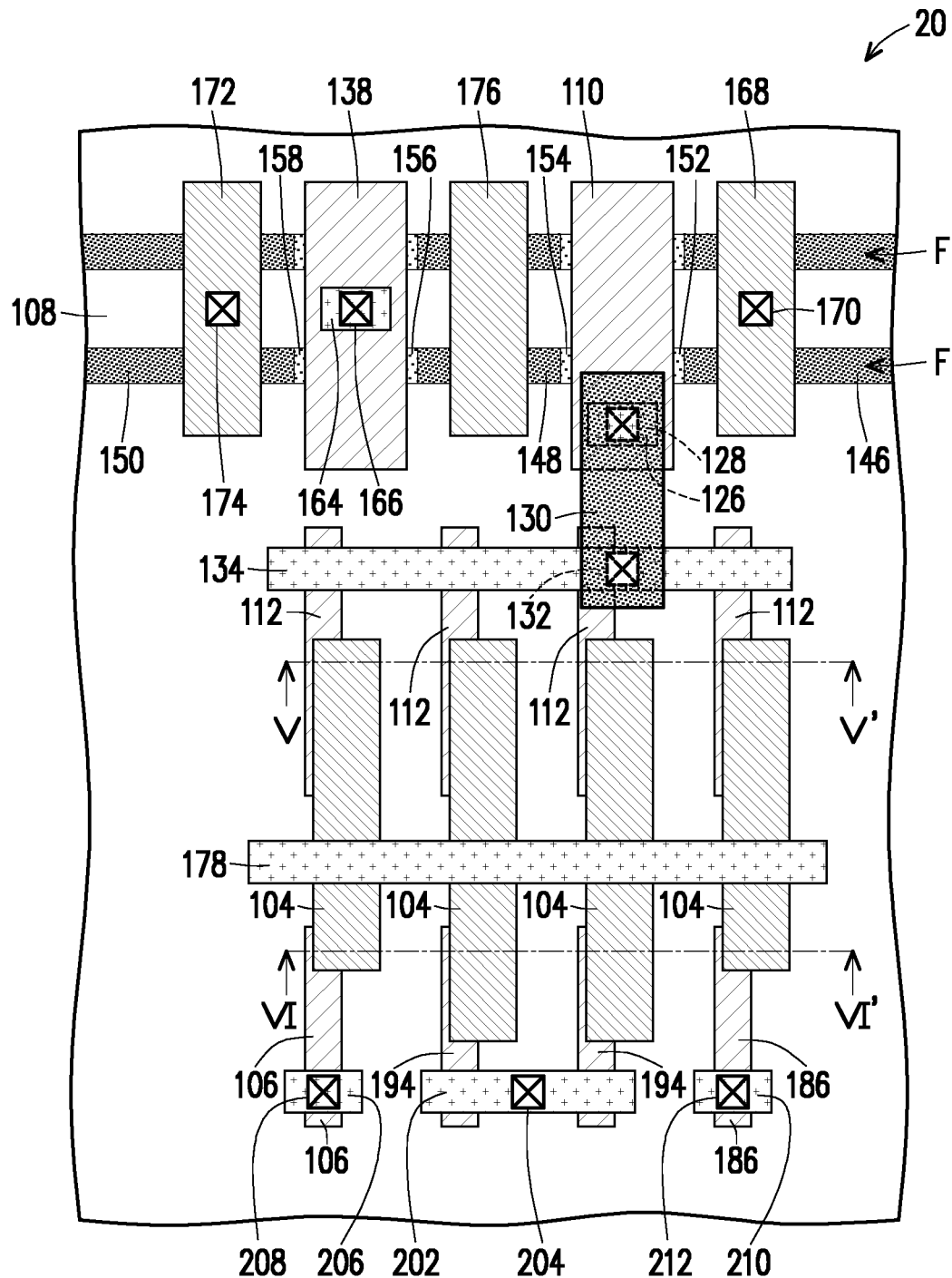
FIG. 3A is a top view illustrating a memory structure according to another embodiment of the invention.
Figure 3B:
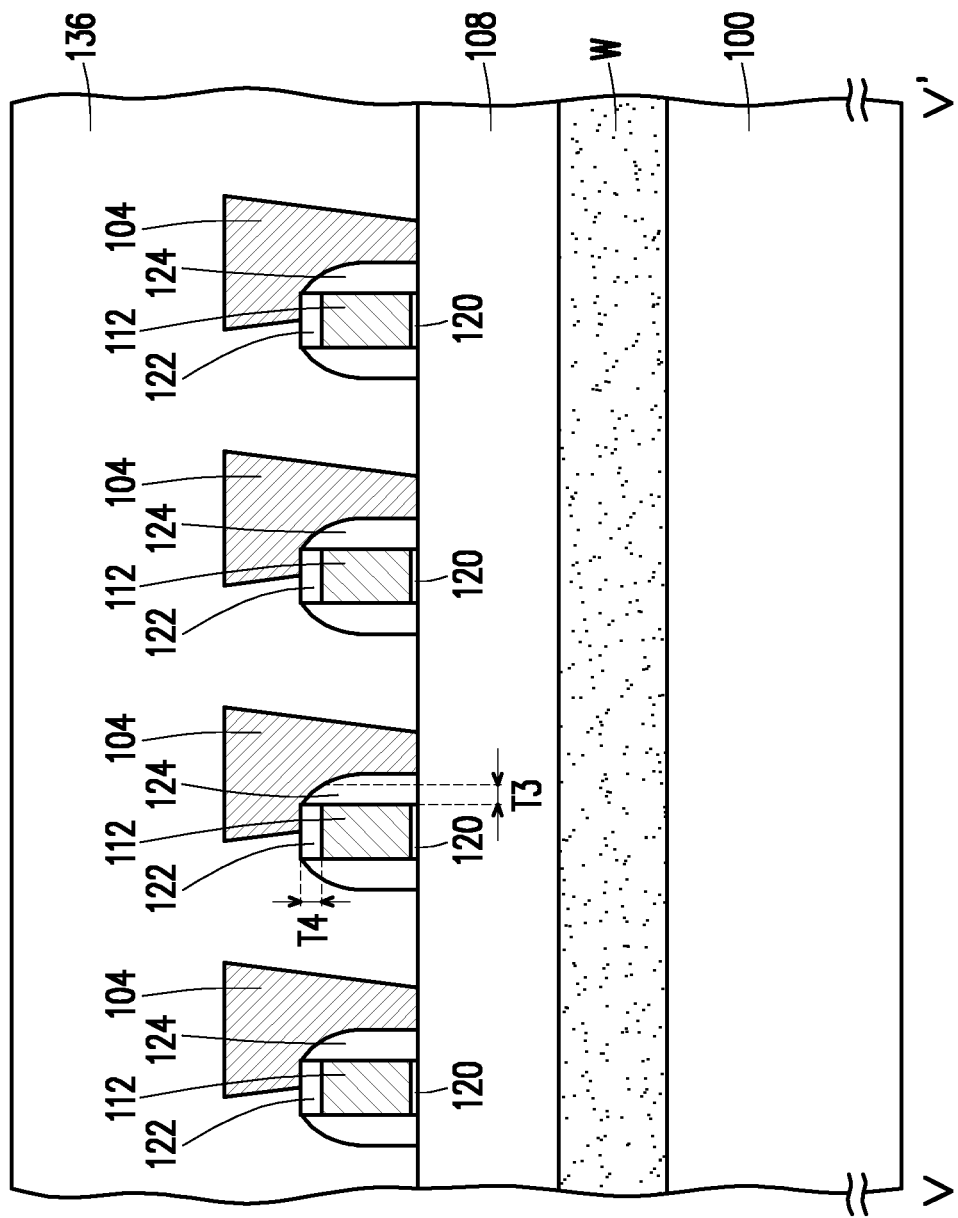
FIG. 3B is a cross-sectional view taken along section line V-V' in FIG. 3A.
Figure 3C:
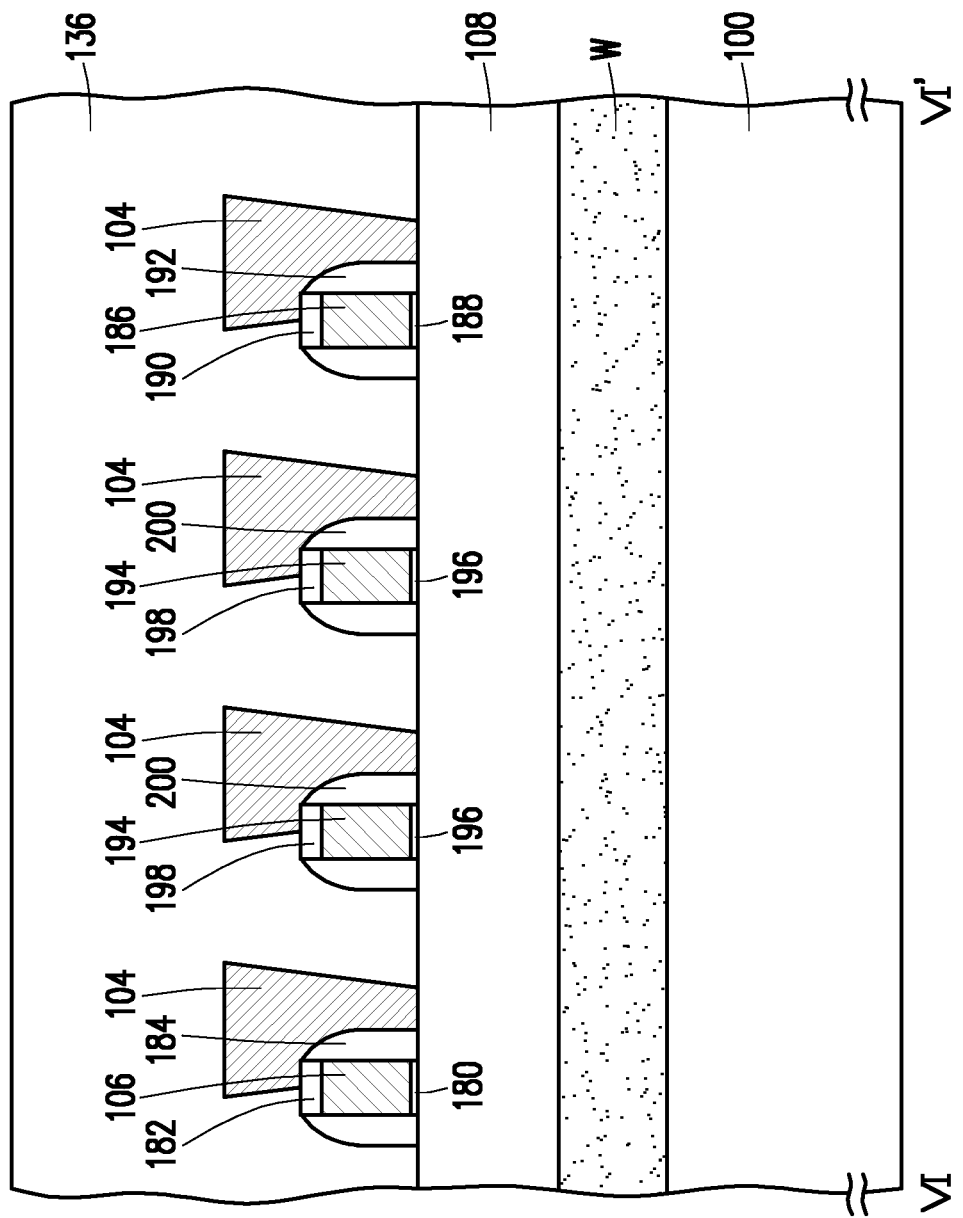
FIG. 3C is a cross-sectional view taken along section line VI-VI' in FIG. 3A.

FIG. 3A is a top view illustrating a memory structure according to another embodiment of the invention. In FIG. 3A, some of the components in FIG. 3B and FIG. 3C are omitted to clearly describe the configuration relationship between the components in FIG. 3A. FIG. 3B is a cross-sectional view taken along section line V-V' in FIG. 3A. FIG. 3C is a cross-sectional view taken along section line VI-VI' in FIG. 3A.

Referring to FIG. 1A and FIG. 3A to FIG. 3B, the difference between the memory structure 20 of FIG. 3A and the memory structure 10 of FIG. 1A is described as follows. In the memory structure 20, the charge storage layer 104 may be further located on the top surface of the gate 112. In addition, the vertical projection of the charge storage layer 104 on the isolation structure 108 may partially overlap the vertical projection of the gate 112 on the isolation structure 108. The charge storage layer 104 and the gate structure 102 are electrically insulated from each other. For example, the charge storage layer 104 and the gate 112 may be electrically insulated from each other by the cap layer 122 and the spacer 124. The thickness T3 (FIG. 3B) of the spacer 124 (dielectric material) between the charge storage layer 104 and the gate structure 102 (e.g., gate 112) may be greater than the thickness T2 (FIG. 1B and FIG. 1C) of the dielectric layer 114 (dielectric material) between the gate structure 102 (e.g., gate 110) and the fin portion F. The thickness T4 (FIG. 3B) of the cap layer 122 (dielectric material) between the charge storage layer 104 and the gate structure 102 (e.g., gate 112)

may be greater than the thickness T2 (FIG. 1B and FIG. 1C) of the dielectric layer 114 (dielectric material) between the gate structure 102 (e.g., gate 110) and the fin portion F. That is, the dielectric material between the charge storage layer 104 and the gate structure 102 may have a greater thickness, so that the loss of the charge stored in the charge storage layer 104 can be prevented, thereby improving the data retention capacity of the memory device.

As shown in FIG. 3C, in the memory structure 20, the charge storage layer 104 may be located on one side of the control gate 106 and may be further located on the top surface of the control gate 106. In addition, the vertical projection of the charge storage layer 104 on the isolation structure 108 may partially overlap the vertical projection of the control gate 106 on the isolation structure 108. The charge storage layer 104 and the control gate 106 may be electrically insulated from each other. For example, the charge storage layer 104 and the control gate 106 may be electrically insulated from each other by the cap layer 182 and the spacer 184. In the memory structure 20, the charge storage layer 104 may be located on one side of the control gate 186 and may be further located on the top surface of the control gate 186. The charge storage layer 104 and the control gate 186 may be electrically insulated from each other. For example, the charge storage layer 104 and the control gate 186 may be electrically insulated from each other by the cap layer 190 and the spacer 192. In the memory structure 20, the charge storage layer 104 may be located on one side of the coupling gate 194 and may be further located on the top surface of the coupling gate 194. The charge storage layer 104 and the coupling gate 194 may be electrically insulated from each other. For example, the charge storage layer 104 and the coupling gate 194 may be electrically insulated from each other by the cap layer 198 and the spacer 200.

Furthermore, the same components in the memory structure 20 and the memory structure 10 are denoted by the same reference symbols, the similar content in the memory structure 20 and the memory structure 10 may be referred to the description of the memory structure 10 in the foregoing embodiment, and the description thereof is omitted.

Figure 4A:
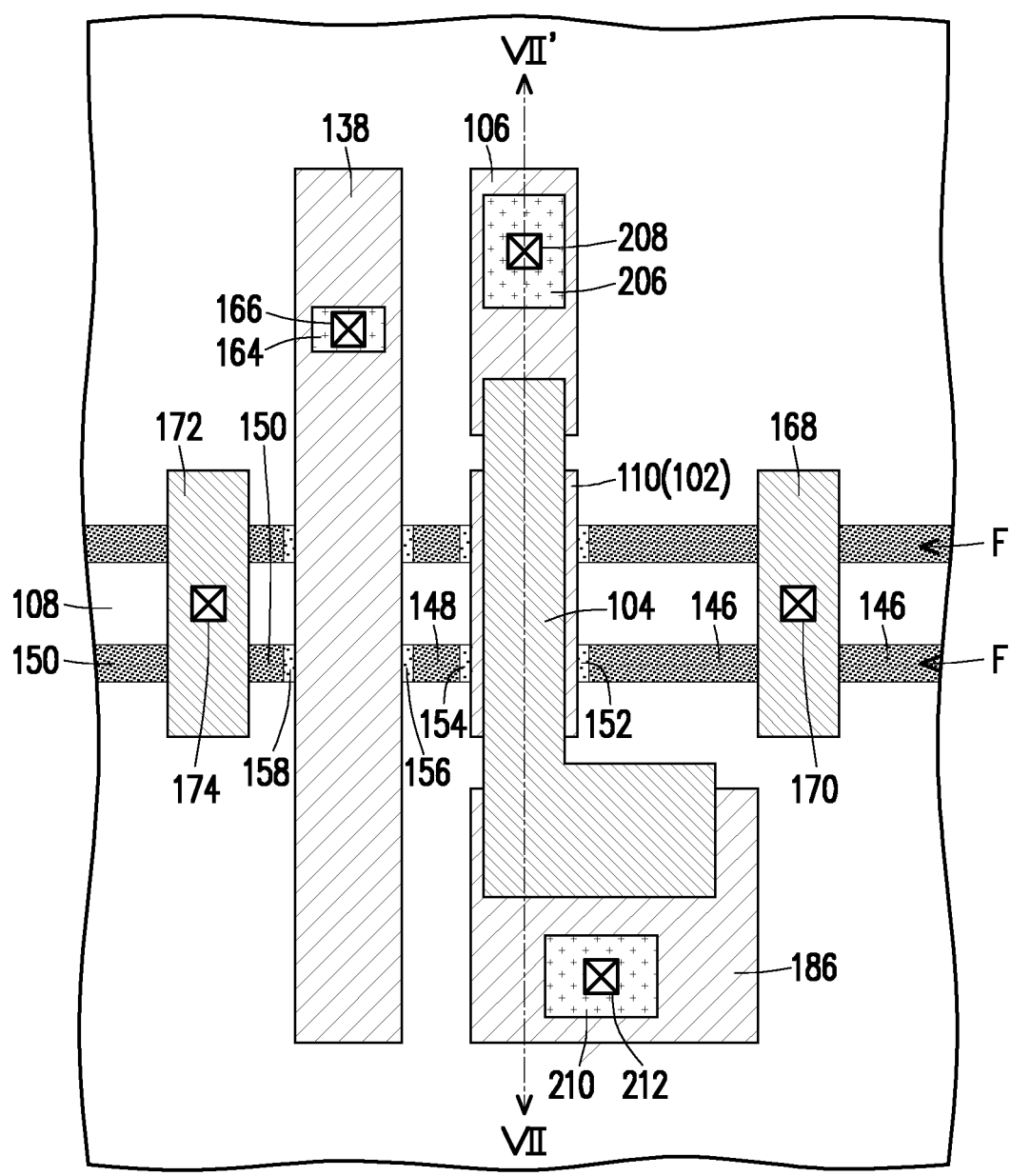
FIG. 4A is a top view illustrating a memory structure according to another embodiment of the invention.
Figure 4B:
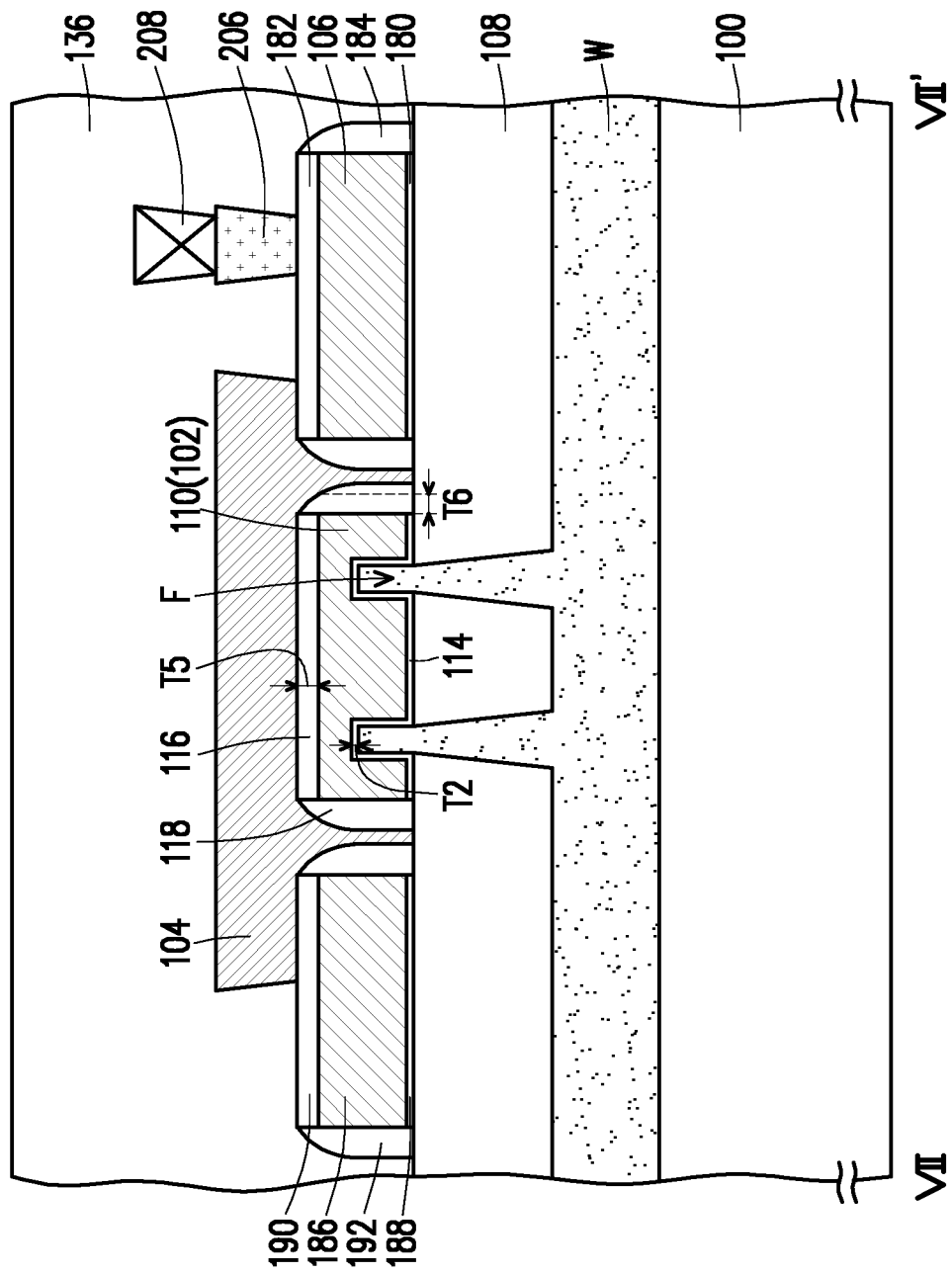
FIG. 4B is a cross-sectional view taken along section line VII-VII' in FIG. 4A.

FIG. 4A is a top view illustrating a memory structure according to another embodiment of the invention. In FIG. 4A, some of the components in FIG. 4B are omitted to clearly describe the configuration relationship between the components in FIG. 4A. FIG. 4B is a cross-sectional view taken along section line VII-VII' in FIG. 4A.

Referring to FIG. 1A, FIG. 4A and FIG. 4B, the difference between the memory structure 30 of FIG. 4A and the memory structure 10 of FIG. 1A is described as follows. In the memory structure 30, the gate 112 in FIG. 1A is omitted. That is, in the memory structure 30, the gate structure 102 only includes the gate 110. The charge storage layer 104 may be adjacent to (coupled to) the gate 110. For example, the charge storage layer 104 may be located on the top surface of the gate 110. In addition, the vertical projection of the charge storage layer 104 on the isolation structure 108 may partially overlap the vertical projection of the gate 110 on the isolation structure 108. The charge storage layer 104 and the gate structure 102 are electrically insulated from each other. For example, the charge storage layer 104 and the gate 110 may be electrically insulated from each other by the cap layer 116 and the spacer 118. The thickness T5 of the cap layer 116 (dielectric material) between the charge storage layer 104 and the gate structure 102 (e.g., gate 110) may be greater than the thickness T2 of the dielectric layer 114 (dielectric material) between the gate structure 102 (e.g., gate 110) and the fin portion F. The thickness T6 of the spacer 118 (dielectric material) between the charge storage layer 104 and the gate structure 102 (e.g., gate 110) may be greater than the thickness T2 of the dielectric layer 114 (dielectric material) between the gate structure 102 (e.g., gate 110) and the fin portion F. That is, the dielectric material between the charge storage layer 104 and the gate structure 102 may have a greater thickness, so that the loss of the charge stored in the charge storage layer 104 can be prevented, thereby improving the data retention capacity of the memory device.

In the memory structure 30, the charge storage layer 104 may be located on one side of the control gate 106 and may be further located on the top surface of the control gate 106. In addition, the vertical projection of the charge storage layer 104 on the isolation structure 108 may partially overlap the vertical projection of the control gate 106 on the isolation structure 108. The charge storage layer 104 and the control gate 106 may be electrically insulated from each other. For example, the charge storage layer 104 and the control gate 106 may be electrically insulated from each other by the cap layer 182 and the spacer 184. The total coupling area between the control gate 106 and the charge storage layer 104 may be smaller than the total coupling area between the gate 110 and the charge storage layer 104, thereby helping to improve the operating performance of the memory device. In the memory structure 30, the charge storage layer 104 may be located on one side of the control gate 186 and may be further located on the top surface of the control gate 186. Furthermore, the vertical projection of the charge storage layer 104 on the isolation structure 108 may partially overlap the vertical projection of the control gate 186 on the isolation structure 108. The charge storage layer 104 and the control gate 186 may be electrically insulated from each other. For example, the charge storage layer 104 and the control gate 186 may be electrically insulated from each other by the cap layer 190 and the spacer 192. The total coupling area between the control gate 106 and the charge storage layer 104 may be smaller than the total coupling area between the control gate 186 and the charge storage layer 104, thereby helping to improve the operating performance of the memory device.

Moreover, in the memory structure 30, components such as the contact 176 and the coupling gate 194 in FIG. 1A may be further omitted. In addition, the same components in the memory structure 30 and the memory structure 10 are denoted by the same reference symbols, the similar content in the memory structure 30 and the memory structure 10 may be referred to the description of the memory structure 10 in the foregoing embodiment, and the description thereof is omitted.

Based on the above embodiments, in the memory structure 30, since the gate 112 in FIG. 1A is omitted, the size of the memory structure 30 can be effectively reduced. On the other hand, since the memory structure 10 and the memory structure 20 respectively have the extended gate 112, it is beneficial to increase the total coupling area between the gate structure 102 and the charge storage layer 104, thereby improving the operating performance of the memory device.

In summary, in the memory structure and the operation method of the aforementioned embodiments, since the charge can be stored in the charge storage layer coupled to the gate structure, the loss of the charge stored in the charge storage layer can be prevented, thereby improving the data retention capacity of the memory device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
a substrate having a fin portion;
a gate structure, wherein a portion of the gate structure is disposed on the fin portion, and the gate structure and the fin portion are electrically insulated from each other;
a charge storage layer coupled to the gate structure, wherein the charge storage layer and the gate structure are electrically insulated from each other; and
a first control gate coupled to the charge storage layer, wherein the first control gate and the charge storage layer are electrically insulated from each other,
wherein the gate structure comprises:
a first gate disposed on the fin portion, wherein the first gate and the fin portion are electrically insulated from each other; and
a second gate, not disposed on the fin portion, and wherein the first gate and the second gate are separated from each other and electrically connected to each other, the charge storage layer is coupled to the second gate, and the charge storage layer and the second gate are electrically insulated from each other.

2. The memory structure according to claim 1, wherein the charge storage layer is not electrically connected to a voltage source.

3. The memory structure according to claim 1, wherein a thickness of a dielectric material between the charge storage layer and the gate structure is greater than a thickness of a dielectric material between the gate structure and the fin portion.

4. The memory structure according to claim 1, further comprising:
an isolation structure disposed on the substrate and located around the fin portion, wherein the second gate, the charge storage layer, and the first control gate are disposed on the isolation structure.

5. The memory structure according to claim 1, wherein the charge storage layer is located on one side of the second gate.

6. The memory structure according to claim 5, wherein the charge storage layer is further located on a top surface of the second gate.

7. The memory structure according to claim 1, wherein a total coupling area between the first control gate and the charge storage layer is smaller than a total coupling area between the second gate and the charge storage layer.

8. The memory structure according to claim 1, comprising a plurality of the second gates and a plurality of the charge storage layers, wherein the plurality of the second gates are electrically connected to each other, the plurality of the charge storage layers are electrically connected to each other, and the plurality of the charge storage layers are coupled to the plurality of the second gates.

9. The memory structure according to claim 1, wherein the gate structure comprises:
a gate disposed on the fin portion, wherein the gate and the fin portion are electrically insulated from each other, the charge storage layer is coupled to the gate, and the charge storage layer and the gate are electrically insulated from each other.

10. The memory structure according to claim 9, wherein the charge storage layer is located on a top surface of the gate.

11. A memory structure, comprising:
a substrate having a fin portion;
a gate structure, wherein a portion of the gate structure is disposed on the fin portion, and the gate structure and the fin portion are electrically insulated from each other:
a charge storage layer coupled to the gate structure, wherein the charge storage layer and the gate structure are electrically insulated from each other;
a first control gate coupled to the charge storage layer, wherein the first control gate and the charge storage layer are electrically insulated from each other; and
a second control gate coupled to the charge storage layer, wherein the second control gate and the charge storage layer are electrically insulated from each other, and a total coupling area between the first control gate and the charge storage layer is smaller than a total coupling area between the second control gate and the charge storage layer,
wherein the gate structure comprises:
a gate disposed on the fin portion, wherein the gate and the fin portion are electrically insulated from each other, the charge storage layer is coupled to the gate, and the charge storage layer and the gate are electrically insulated from each other.

12. The memory structure according to claim 1, wherein the substrate has a plurality of the fin portions, and the first gate is disposed across the plurality of the fin portions.

13. The memory structure according to claim 1, further comprising:
a contact electrically connected to a doped region in the fin portion, wherein the contact and the charge storage layer are derived from the same material layer.

14. The memory structure according to claim 1, further comprising:
a select gate disposed on the fin portion on one side of the first gate, wherein the select gate and the fin portion are electrically insulated from each other.

15. The memory structure according to claim 1, further comprising:
a second control gate coupled to the charge storage layer, wherein the second control gate and the charge storage layer are electrically insulated from each other.

16. The memory structure according to claim 1, further comprising:
a coupling gate coupled to the charge storage layer, wherein the coupling gate and the charge storage layer are electrically insulated from each other.

17. A memory structure, comprising:
a substrate having a fin portion;
a gate structure, wherein a portion of the gate structure is disposed on the fin portion, and the gate structure and the fin portion are electrically insulated from each other:
a charge storage layer coupled to the gate structure, wherein the charge storage layer and the gate structure are electrically insulated from each other;
a first control gate coupled to the charge storage layer, wherein the first control gate and the charge storage layer are electrically insulated from each other; and
a coupling gate coupled to the charge storage layer, wherein the coupling gate and the charge storage layer are electrically insulated from each other, wherein a total coupling area between the first control gate and the charge storage layer is smaller than a total coupling area between the coupling gate and the charge storage layer.

18. An operation method of the memory structure according to claim 1, comprising performing a program operation on the memory structure, wherein the program operation comprises:

injecting a charge into the charge storage layer from the first control gate.

19. An operation method of the memory structure according to claim 1, comprising performing an erase operation on the memory structure, wherein the erase operation comprises:

ejecting a charge from the charge storage layer through the first control gate.

* * * * *